US012616994B2

(12) United States Patent
Lee

(10) Patent No.: US 12,616,994 B2
(45) Date of Patent: May 5, 2026

(54) APPARATUS FOR PREVENTING BLOCKAGE OF FLOATING STAGE, SUBSTRATE PROCESSING APPARATUS AND SUBSTRATE PROCESSING METHOD

(71) Applicant: SEMES CO., LTD., Chungcheongnam-do (KR)

(72) Inventor: Bong Moon Lee, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 567 days.

(21) Appl. No.: 18/099,911

(22) Filed: Jan. 20, 2023

(65) Prior Publication Data

US 2024/0001401 A1     Jan. 4, 2024

(30) Foreign Application Priority Data

Jun. 29, 2022    (KR) ........................ 10-2022-0079380

(51) Int. Cl.
| | |
|---|---|
| *B05C 13/02* | (2006.01) |
| *B05C 5/02* | (2006.01) |
| *B05C 13/00* | (2006.01) |
| *B08B 3/02* | (2006.01) |
| *B08B 5/04* | (2006.01) |
| *B08B 7/04* | (2006.01) |
| *B65G 49/06* | (2006.01) |
| *H10P 72/00* | (2026.01) |
| *H10P 72/30* | (2026.01) |
| *G02B 5/20* | (2006.01) |

(52) U.S. Cl.
CPC ............ *B05C 13/00* (2013.01); *B05C 5/0291* (2013.01); *B08B 3/022* (2013.01); *B08B 5/043* (2013.01); *B08B 7/04* (2013.01); *B65G 49/061*

(2013.01); *B65G 49/065* (2013.01); *H10P 72/0414* (2026.01); *H10P 72/0448* (2026.01); *H10P 72/36* (2026.01); *H10P 72/3604* (2026.01); *B05C 13/02* (2013.01); *G02B 5/201* (2013.01)

(58) Field of Classification Search
None
See application file for complete search history.

(56) References Cited

U.S. PATENT DOCUMENTS

| | | | | |
|---|---|---|---|---|
| 2007/0017442 A1* | 1/2007 | Yamasaki | ......... | H01L 21/67784 |
| | | | | 118/695 |
| 2024/0092591 A1* | 3/2024 | Choi | ................ | H01L 21/68742 |

FOREIGN PATENT DOCUMENTS

| | | | | |
|---|---|---|---|---|
| KR | 10-2009-0112586 | 10/2009 | | |
| KR | 20090112586 A | * 10/2009 | ............. | B05C 13/02 |
| KR | 10-2011-0077341 | 7/2011 | | |

(Continued)

OTHER PUBLICATIONS

Office Action dated May 30, 2024 for Korean Patent Application No. 10-2022-0079380 and its English translation from Global Dossier.

*Primary Examiner* — Binu Thomas
(74) *Attorney, Agent, or Firm* — WOMBLE BOND DICKINSON (US) LLP

(57)     ABSTRACT

An apparatus for preventing blockage of a floating stage includes a moving member moving between a floating stage for lifting a substrate and a nozzle disposed above the floating stage, and a cover installed on the moving member and moving between the floating stage and the nozzle by the moving member to cover the floating stage.

16 Claims, 13 Drawing Sheets

(56) References Cited

FOREIGN PATENT DOCUMENTS

| | | |
|----|-------------------|--------|
| KR | 10-2013-0084742 | 7/2013 |
| KR | 10-2020-0097640 | 8/2020 |
| KR | 10-2021-0033910 | 3/2021 |
| KR | 10-2022-0001533 | 1/2022 |

\* cited by examiner

[FIG. 1]
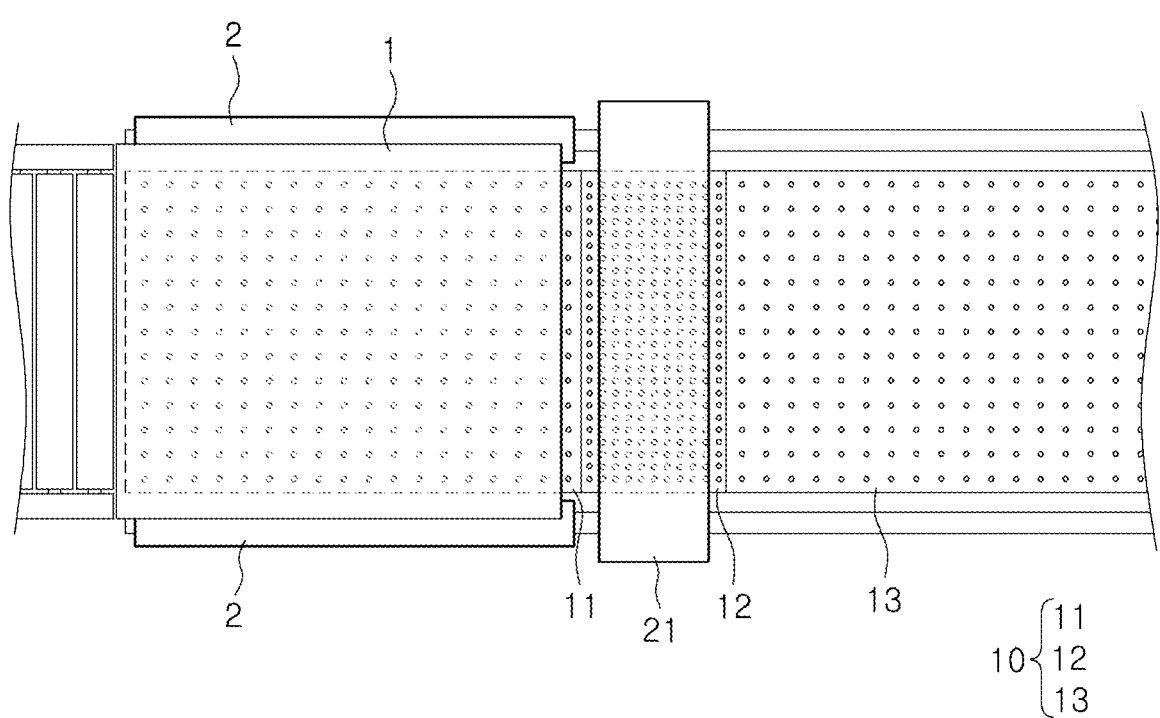

[FIG. 2]
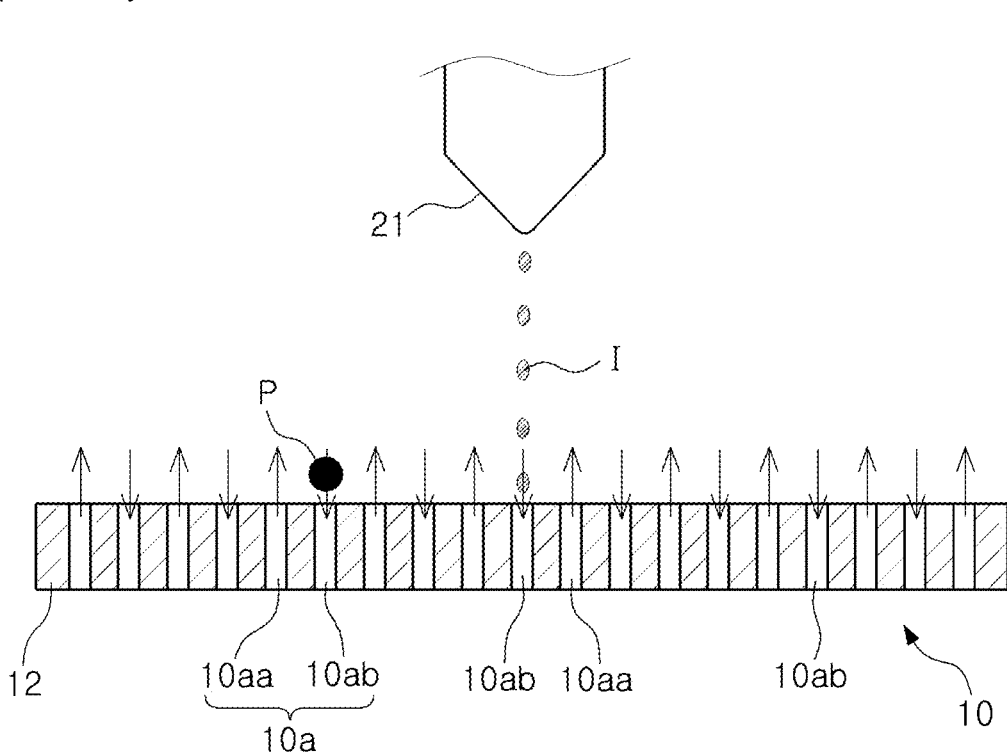

[FIG. 3]
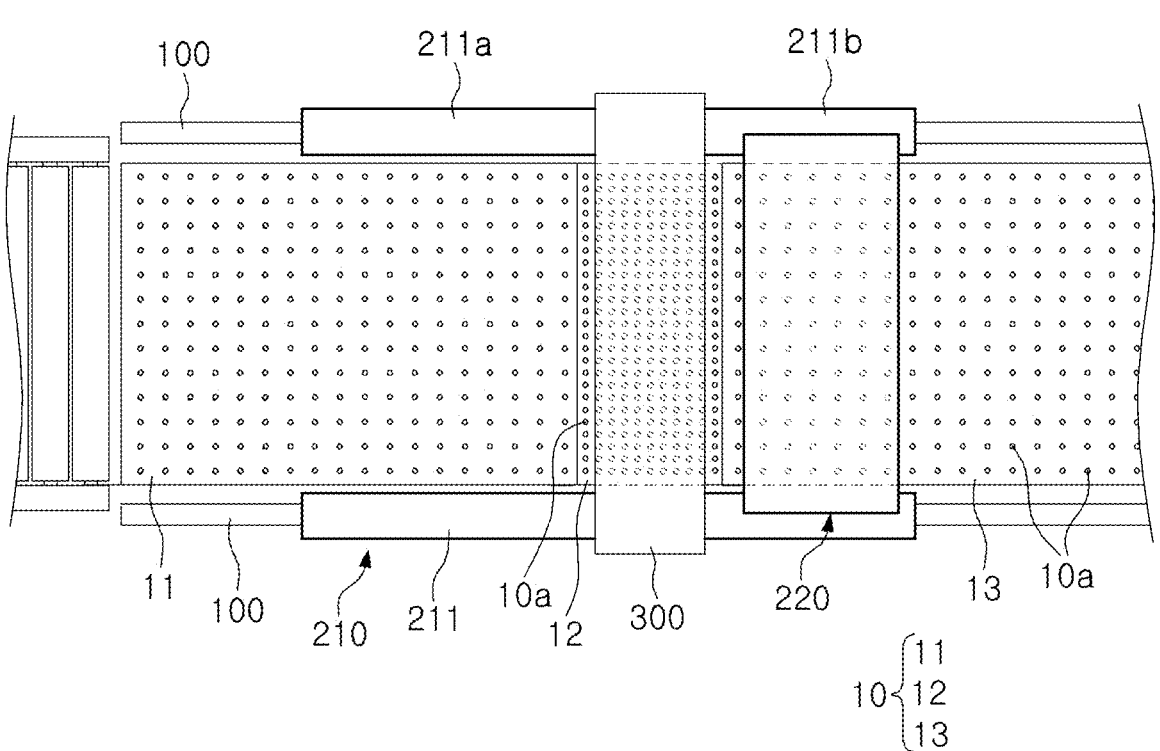

[FIG. 4]
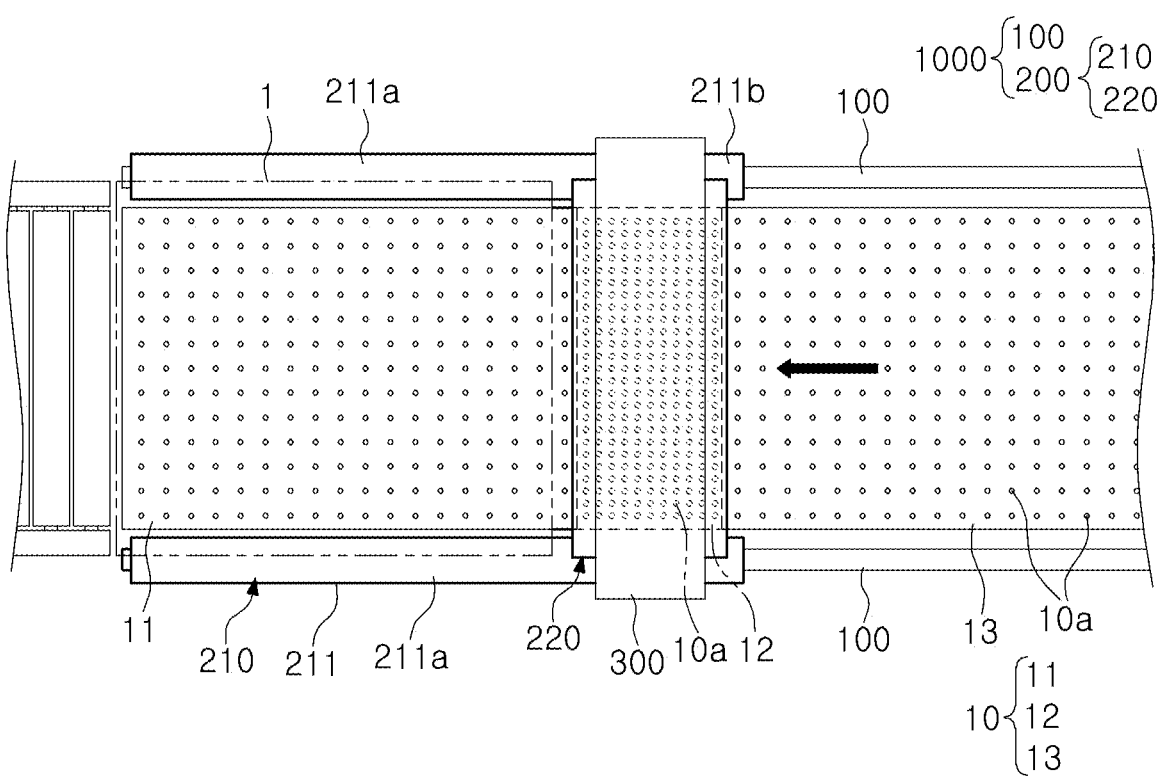

[FIG. 5]
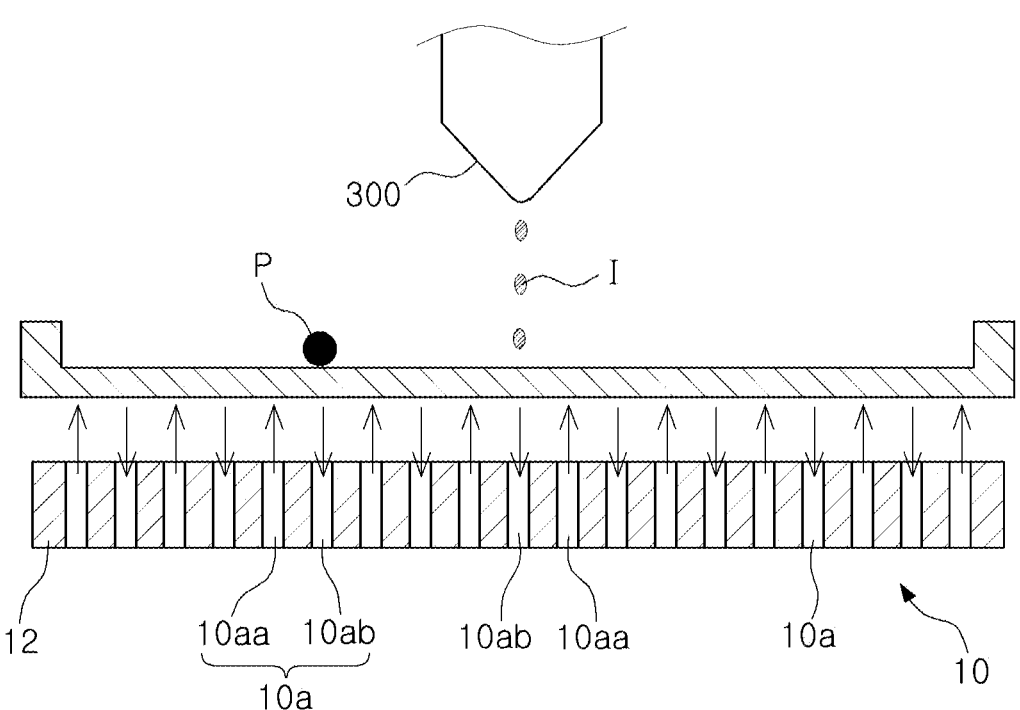

[FIG. 6]
(a)
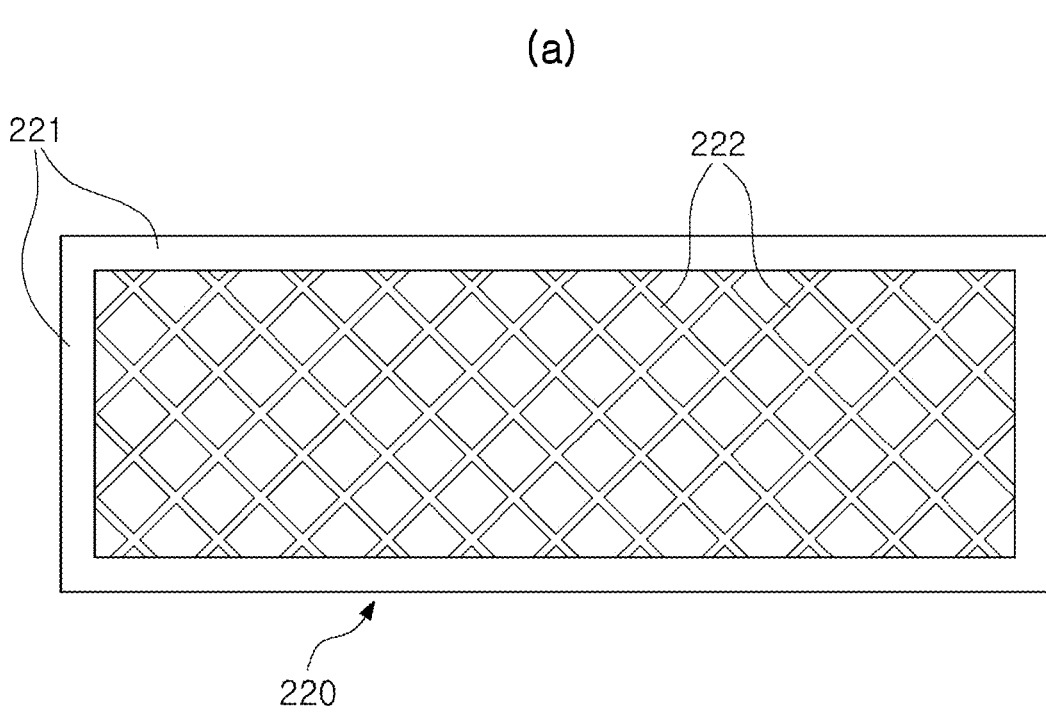
(b)
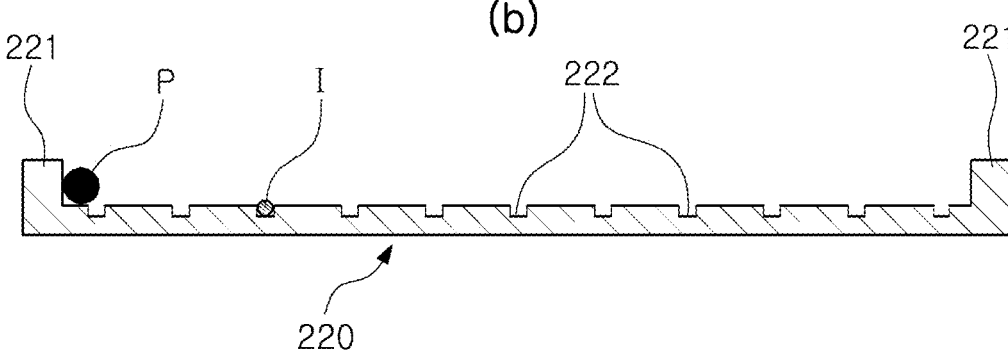

[FIG. 7]
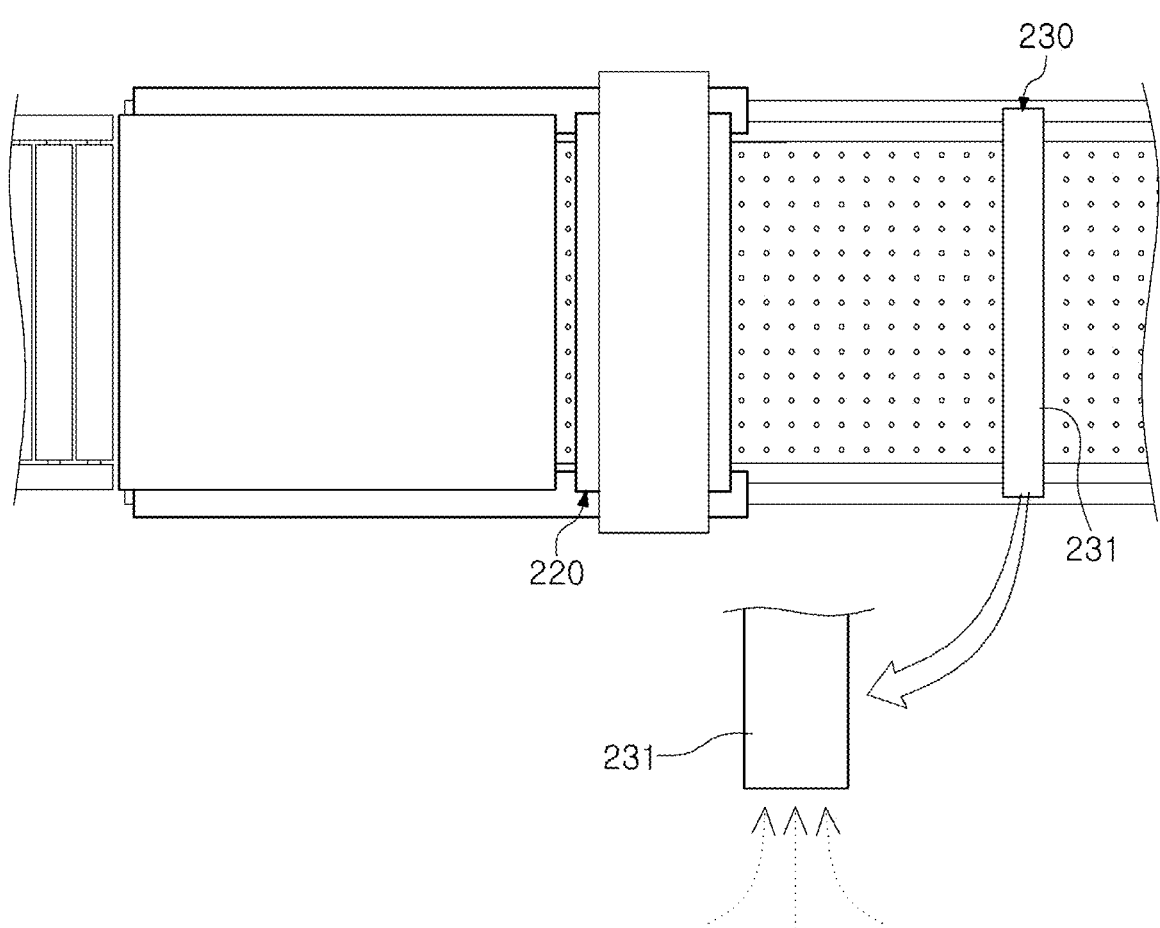

[FIG. 8]
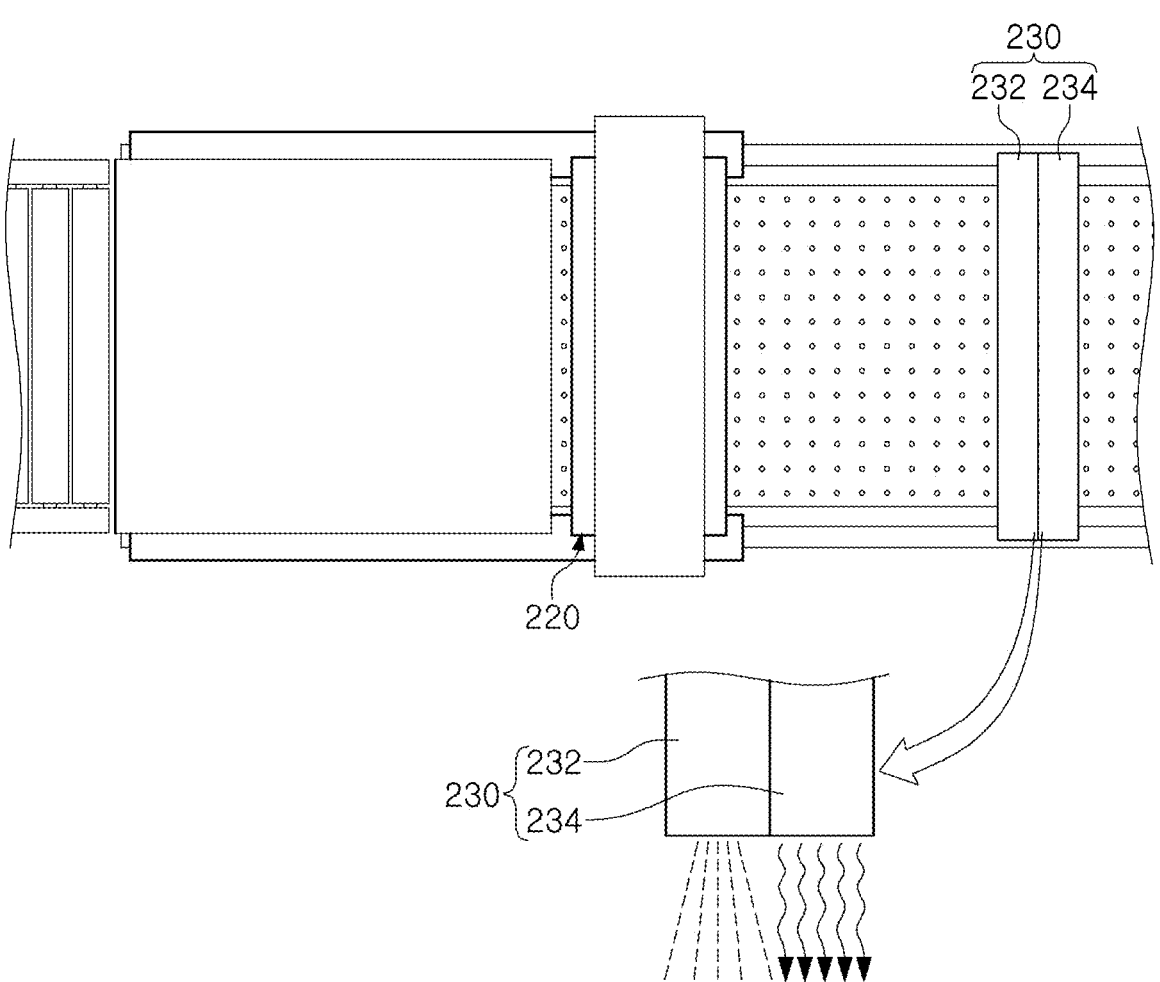

[FIG. 9]
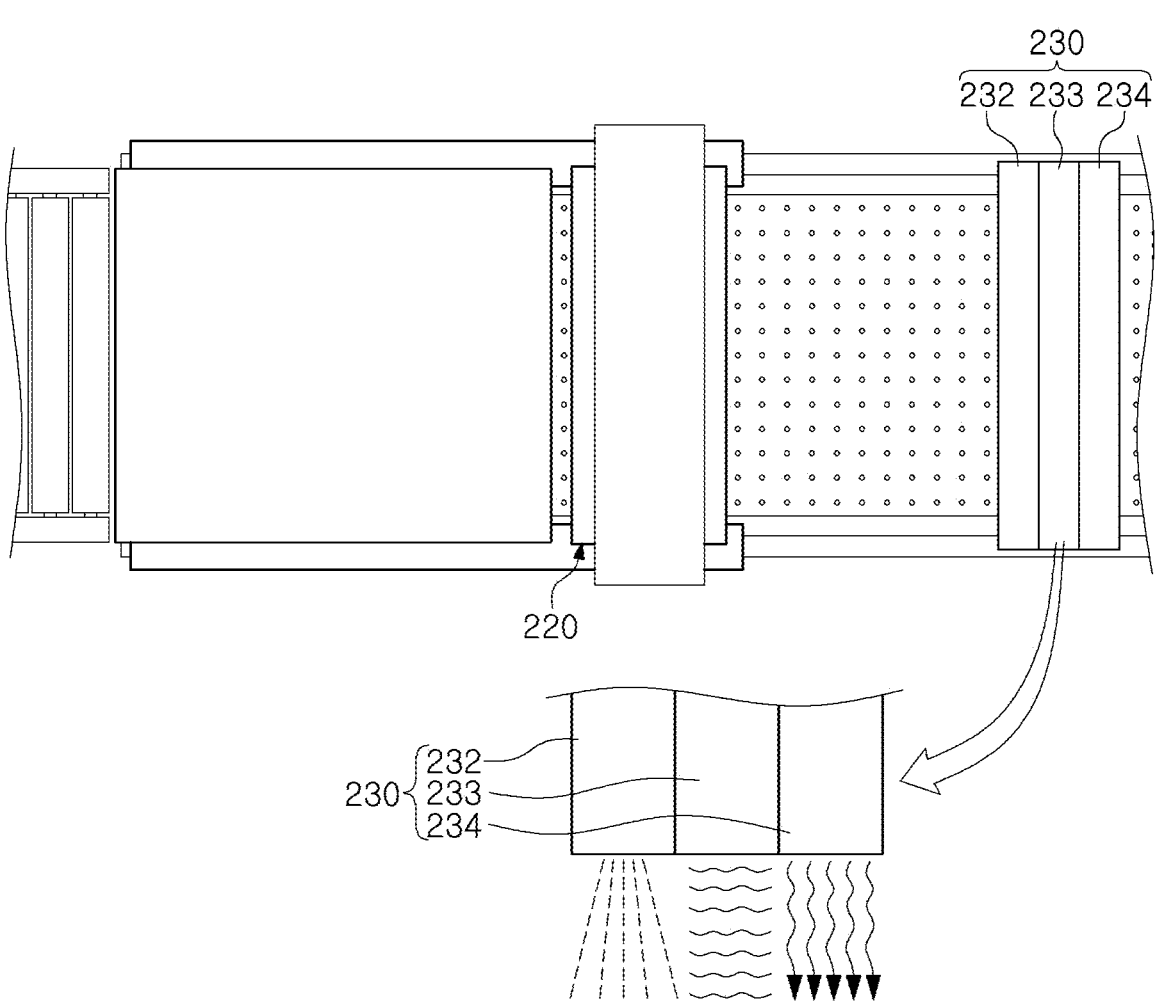

[FIG. 10]
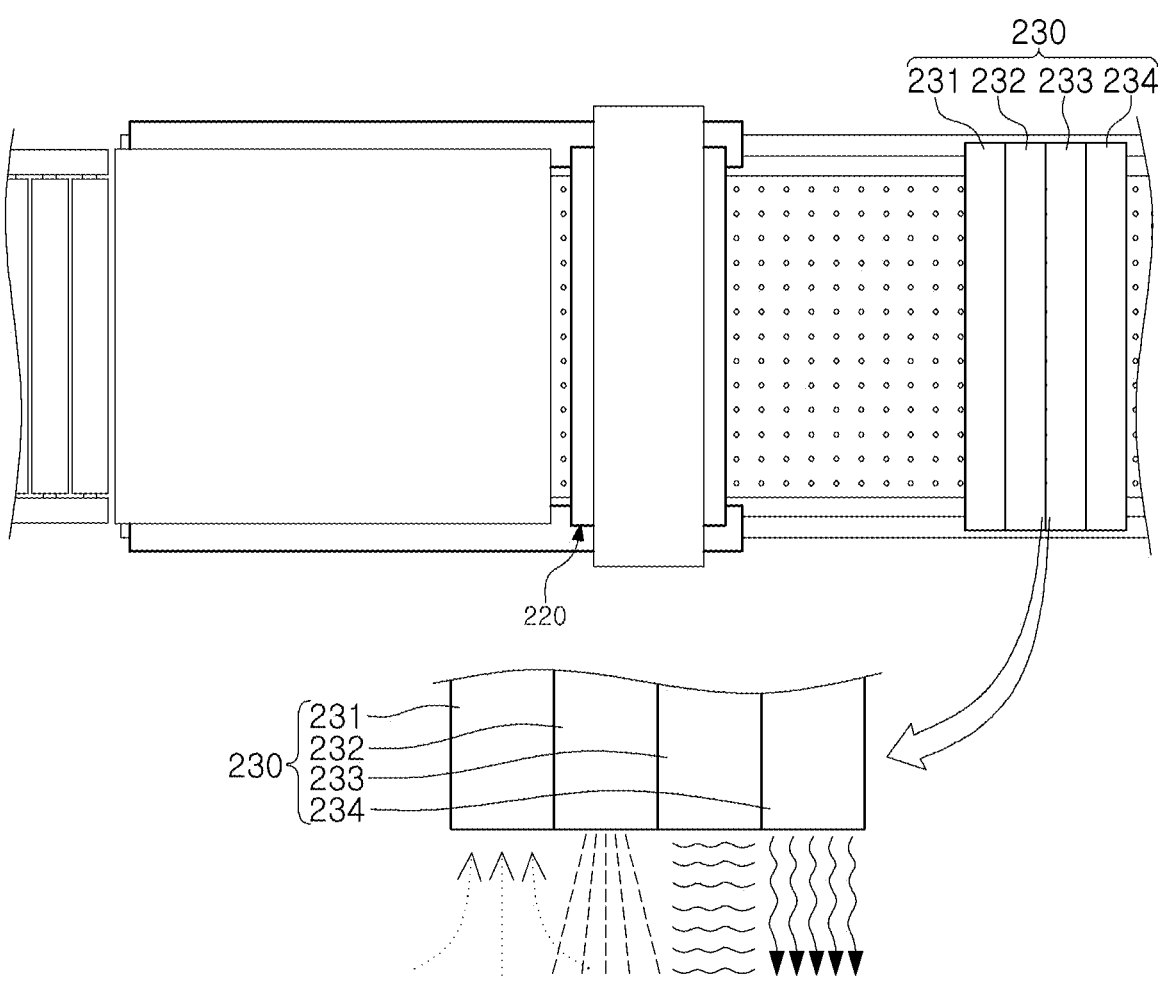

[FIG. 11]
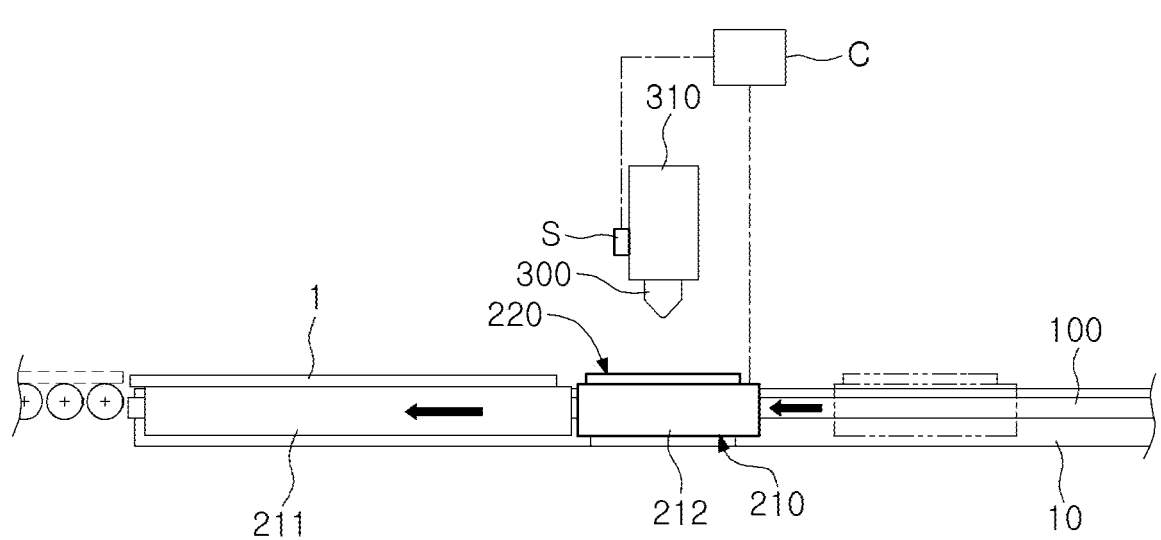

[FIG. 12]
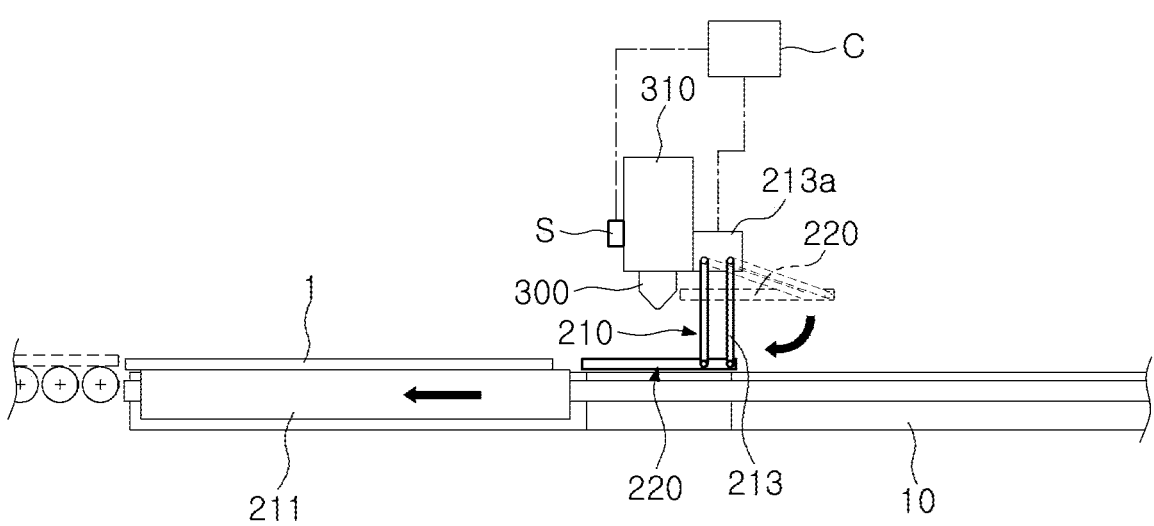

[FIG. 13]
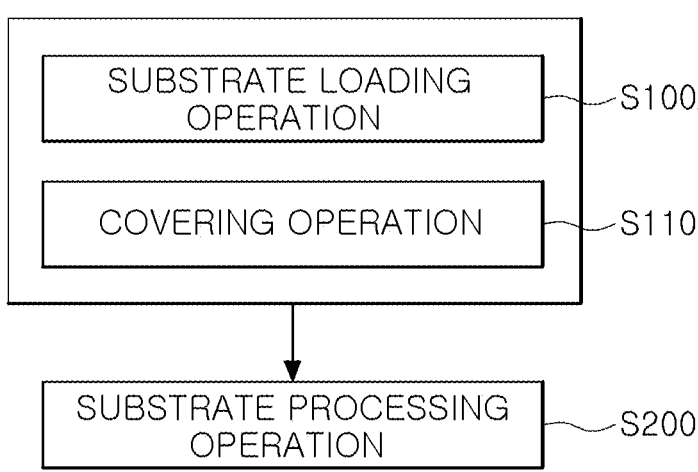

APPARATUS FOR PREVENTING BLOCKAGE OF FLOATING STAGE, SUBSTRATE PROCESSING APPARATUS AND SUBSTRATE PROCESSING METHOD

CROSS-REFERENCE TO RELATED APPLICATION(S)

This application claims benefit of priority to Korean Patent Application No. 10-2022-0079380 filed on Jun. 29, 2022 in the Korean Intellectual Property Office, the disclosure of which is incorporated herein by reference in its entirety.

BACKGROUND

1. Field

The present disclosure relates to an apparatus for preventing blockage of a floating stage in a facility for transferring substrates from a floating stage, a substrate processing apparatus, and a substrate processing method.

2. Description of Related Art

In the process of manufacturing a flat panel display, a coating process of applying a chemical solution such as Red, Green, or Black (RGB) ink or a resist solution to the surface of a target substrate formed of glass or the like is accompanied.

In the related art, when the size of the display is small, by rotating the substrate while applying a chemical liquid to the central portion of the substrate, which is the material of the display, a spin coating method is used to apply a chemical solution to the surface of the substrate.

However, as the size of the display increases, the spin coating method is rarely used, a coating method in which, while the substrate is moved on the floating stage to pass through the lower side of the slit-shaped nozzle having a length corresponding to the width of the substrate, a liquid chemical sprayed from a nozzle is applied to the surface of a substrate, is used.

SUMMARY

An aspect of the present disclosure is to provide an apparatus for preventing blockage of a floating stage, a substrate processing apparatus, and a substrate processing method, in which an air intake hole of the floating stage may be prevented from being clogged.

According to an aspect of the present disclosure, an apparatus for preventing blockage of a floating stage includes a moving member moving toward a floating stage for lifting a substrate; and a cover installed on the moving member and moved toward the floating stage by the moving member to cover the floating stage.

The moving member may be a gripper holding and transferring the substrate.

The cover may be installed on a cover mounting portion of gripper, opposite to a substrate loading portion of gripper on which the substrate is loaded in the gripper.

The floating stage may be divided into an entrance floating portion, a coating floating portion and an exit floating portion in a transfer direction of the substrate, and the cover may have a plate shape and may be larger than a size of an upper surface of the coating floating portion to cover an upper surface of a portion disposed in the floating stage below the nozzle.

The cover may have an anti-fall bump disposed on a rim of an upper surface thereof.

The cover may have a plurality of grooves in an upper surface thereof.

The apparatus for preventing blockage of a floating stage may further include a substrate detection sensor installed on a nozzle support in which the nozzle is installed, and detecting the substrate below the nozzle.

The moving member may be a movable body installed on rails disposed on both sides of the floating stage, and the movable body may be electrically connected to the substrate detection sensor and a controller and may move between the floating stage and the nozzle when the substrate detection sensor detects an absence of the substrate below the nozzle.

The moving member may be a rotating body installed on the nozzle support, and the rotating body may be electrically connected to the substrate detection sensor by a controller, and may rotate between the floating stage and the nozzle when the substrate detection sensor detects an absence of the substrate below the nozzle.

According to an aspect of the present disclosure, a substrate processing apparatus includes a rail disposed on both sides of a floating stage lifting a substrate in a longitudinal direction of the floating stage; a moving member disposed on the rail, moving along the rail, and holding and transporting the substrate; a cover installed on the moving member, moved toward the floating stage by the moving member and covering the floating stage; and a nozzle disposed above the floating stage and processing the substrate by applying a liquid chemical to the substrate moved toward the floating stage.

The substrate processing apparatus may further include a cleaning unit disposed above the cover and cleaning the cover. The cleaning unit may include a suction member suctioning foreign particles or ink on an upper surface of the cover. The cleaning unit may include a cleaning member spraying a cleaning liquid onto the upper surface of the cover. The cleaning unit may further include an ultrasonic wave generating member disposed parallel to the cleaning member and ultrasonically vibrating the cleaning liquid. The cleaning unit may further include a drying member disposed in parallel with the cleaning member and drying the cover wet with the cleaning liquid.

The cleaning unit may include a suction member suctioning foreign particles or ink on an upper surface of the cover; a cleaning member spraying a cleaning liquid onto the upper surface of the cover; an ultrasonic wave generating member vibrating the cleaning liquid ultrasonically; and a drying member drying the cover wet with the cleaning liquid. The suction member, the cleaning member, the ultrasonic wave generating member, and the drying member are sequentially disposed in a moving direction of the moving member.

According to an aspect of the present disclosure, a substrate processing method includes a substrate loading operation of loading a substrate onto a gripper by moving the gripper to a loading position of the substrate; a covering operation of covering a floating stage by moving a cover toward the floating stage floating the substrate; and a substrate transfer operation of processing the substrate on the floating stage by moving the gripper loaded with the substrate toward the floating stage.

The cover may be installed in a cover mounting portion of gripper, opposite to a substrate loading portion of gripper on which the substrate is loaded, and the covering operation may proceed during the substrate loading operation.

BRIEF DESCRIPTION OF DRAWINGS

The above and other aspects, features, and advantages of the present disclosure will be more clearly understood from the following detailed description, taken in conjunction with the accompanying drawings, in which:

FIG. 1 is a plan view illustrating that a gripper according to the related art loads a substrate on one side of a floating stage;

FIG. 2 is a side cross-sectional view illustrating that the floating stage of FIG. 1 is clogged with foreign particles and ink;

FIG. 3 is a plan view illustrating that a cover is installed on a moving member in an apparatus for preventing blockage of a floating stage of a substrate processing apparatus according to a first embodiment;

FIG. 4 is a plan view illustrating that a coating floating portion of a floating stage is covered by a cover of an apparatus for preventing blockage of a floating stage;

FIG. 5 is a cross-sectional view illustrating that contamination of the floating stage by foreign particles and ink is blocked by the cover of FIG. 4;

FIG. 6 is a plan view and a cross-sectional view illustrating a cover in an apparatus for preventing blockage of a floating stage of a substrate processing apparatus according to a second embodiment;

FIG. 7 is a view illustrating a suction member as a cleaning unit in an apparatus for preventing blockage of a floating stage of a substrate processing apparatus according to a third embodiment;

FIG. 8 is a view illustrating a cleaning member and a drying member as a cleaning unit in an apparatus for preventing blockage of a floating stage of a substrate processing apparatus according to a fourth embodiment;

FIG. 9 is a view illustrating a cleaning member, an ultrasonic wave generating member, and a drying member as cleaning units in an apparatus for preventing blockage of a floating stage of a substrate processing apparatus according to a fifth embodiment;

FIG. 10 is a view illustrating a suction member, a cleaning member, an ultrasonic wave generating member, and a drying member as cleaning units in an apparatus for preventing blockage of a floating stage of a substrate processing apparatus according to a sixth embodiment;

FIG. 11 is a view illustrating an apparatus for preventing blockage of a floating stage of a substrate processing apparatus according to a seventh embodiment;

FIG. 12 is a view illustrating an apparatus for preventing blockage of a floating stage of a substrate processing apparatus according to an eighth embodiment; and FIG. 13 is a flowchart illustrating a substrate processing method according to another aspect of the present disclosure.

DETAILED DESCRIPTION

Hereinafter, embodiments will be described in detail so that those skilled in the art may easily practice the present disclosure with reference to the accompanying drawings. However, in describing a preferred embodiment in detail, if it is determined that a detailed description of a related known function or configuration may unnecessarily obscure the gist of the present disclosure, the detailed description will be omitted. In addition, the same reference numerals are used throughout the drawings for parts having similar functions and actions. In addition, in the present specification, terms such as 'on', 'upper portion', 'upper surface', 'below', 'lower portion', 'lower surface', 'side' and the like are based on the drawings, and may be changed depending on the direction in which components are actually disposed.

In addition, throughout the specification, when a part is said to be 'connected' to another part, it is not only 'directly connected', but also 'indirectly connected' with other components therebetween. Further, 'including' a certain component means that other components may be further included, rather than excluding other components unless otherwise stated.

FIG. 1 is a plan view illustrating that a gripper according to the related art loads a substrate on one side of a floating stage, and FIG. 2 is a side cross-sectional view illustrating that the floating stage of FIG. 1 is clogged with foreign particles and ink.

Referring to the drawings, after loading a substrate 1, a gripper 2 according to the related art holds the substrate 1 and transfers the substrate to a floating stage 10, to apply a chemical solution to the substrate 1.

A nozzle 21 is disposed above the floating stage 10, and the nozzle 21 injects a liquid chemical onto the substrate 1 transferred through the space between the floating stage 10 and the nozzle 21. In this case, the chemical liquid may be, for example, Red, Green, and Blue (RGB) ink, and is used to make the substrate 1 used as a material for a display into a color substrate. In addition, the floating stage 10 includes an air hole 10a for floating the substrate 1 with air. At this time, the air hole 10a includes an air ejection hole 10aa for ejecting air and an air intake hole 10ab for suctioning air. The air ejection hole 10aa ejects air to the upper side where the substrate 1 is positioned to lift the substrate 1 to a certain extent. The air intake hole 10ab pulls the substrate 1 by suctioning air on the upper side where the substrate 1 is located. These air intake holes 10ab allow the substrate 1 to be lifted by the air ejected from the air ejection holes 10aa in a stable posture without being shaken. The floating stage 10 may be divided into an entrance floating portion 11, a coating floating portion 12, and an exit floating portion 13 in the transfer direction of the substrate 1. In the floating stage 10, the coating floating portion 12, which is a portion located below the nozzle 21, is formed to have a relatively larger number of air ejection holes 10aa and air intake holes 10ab than other portions. This is to precisely control the separation distance between the substrate 1 and the floating stage 10 while lowering the floating height of the substrate 1 in the operation of discharging the chemical solution to the upper surface of the substrate 1 by the nozzle 21, thereby further preventing the shaking of the substrate 1 to maintain stable floating.

When the chemical solution is sprayed by the nozzle 21, the upper surface of the substrate 1 is coated with the chemical solution. Before such application, the gripper 2 moves to the substrate loading position (left position of the floating stage 10 in FIG. 1) for loading the substrate 1.

When the substrate 1 is disposed under the nozzle 21 by the gripper 2, the chemical solution is sprayed by the nozzle 21 so that the upper surface of the substrate 1 is coated with the chemical solution. By the way, while the gripper 2 moves to the substrate loading position for loading of the substrate 1 and waits, before the application of the substrate 1; in the floating stage 10, the coating floating portion 12 is not covered by the substrate 1, and thus remains open. Since the floating stage 10 maintains a continuously operated state even while not lifting the substrate 1, particles P of foreign matter in the surroundings may block the air hole 10*a* of the coating floating portion 12 in the floating stage 10. In detail, when the particles P of foreign matter in the vicinity flow into the air intake hole 10*ab* of the air hole 10*a*, the air intake hole 10*ab* is easily clogged. In addition, when the ink I remaining in the nozzle 21 falls and flows into the air intake hole 10*ab*, the air intake hole 10*ab* is clogged. In this case, as the floating of the substrate 1 is not precisely controlled in the coating operation of the substrate 1, drop defects of the chemical solution to be discharged occurs. However, it may be difficult to detect the clogging of the air intake hole 10*ab* in real time, and when a defect is detected in the inspection operation of the substrate 1 later, this clogging is recognized. Ultimately, as the contaminated floating stage 10 should be disassembled and then cleaned, the coating process of the substrate 1 cannot be performed for a long time, resulting in a decrease in productivity.

FIG. 3 is a plan view illustrating that a cover is installed on a moving member in the apparatus for preventing block-age of a floating stage of a substrate processing apparatus according to a first embodiment, FIG. 4 is a plan view illustrating that the coating floating portion of the floating stage is covered by the cover of the apparatus of preventing of the floating stage, and FIG. 5 is a cross-sectional view illustrating that contamination of the floating stage by par-ticles and ink is blocked by the cover of FIG. 4.

Referring to the drawings, a substrate processing appara-tus 1000 according to an embodiment of the present disclo-sure includes an apparatus 200 for preventing blockage of a floating stage and a nozzle 300. The apparatus for preventing blockage of a floating stage 200 includes a moving member 210 and a cover 220. The moving member 210 reciprocates toward the floating stage 10 for lifting the substrate 1. In detail, the moving member 210 moves between the floating stage 10 and the nozzle 300 disposed above the floating stage 10. The cover 220 may be installed on the moving member 210 and be moved toward the floating stage 10 by the moving member 210, for example, between the floating stage 10 and the nozzle 300 to cover the floating stage 10. In detail, the floating stage (10 in FIG. 4) may be divided into an entrance floating portion 11, a coating floating portion 12, and an exit raised portion 13 in the transfer direction of the substrate 1, and the cover 220 may cover the coating floating portion 12 below the nozzle 300.

In this case, the substrate processing apparatus 1000 according to an embodiment may further include a rail 100. The rail 100 is disposed in the longitudinal direction of the floating stage 10 on both sides of the floating stage 10 for lifting the substrate 1. The moving member 210 may be disposed on the rail 100 and may have a structure moving along the rail 100. Although not illustrated in the drawing, the moving member 210 may be moved by receiving driving force from a motor.

As an example, the moving member 210 may be a gripper 211 for holding and transferring the substrate 1 as illustrated in the drawing. In this case, the cover 220 may be installed on a portion of the gripper 211. In detail, as illustrated in the drawing, the cover 220 maybe installed on a cover mounting portion 211*b* of gripper 211, which is the opposite side of a substrate loading portion 211*a* of gripper 211 on which the substrate 1 is loaded. The cover 220 is plate-shaped and has a size capable of covering the upper surface of the coating floating portion 12 of the floating stage 10, which is a portion disposed below the nozzle 300 in the floating stage 10, and in detail, is formed to have a larger size than the upper surface size of the coating floating portion 12.

In order for the gripper 211 to load the substrate 1 before the application of the substrate 1, while the moving member 210 moves from the position of FIG. 3 to the substrate loading position of FIG. 4 and waits, the cover 220 may cover the upper surface of the coating floating portion 12. Accordingly, the cover 220 may prevent particles of foreign matter (P in FIG. 5) from entering the air hole (10*a* in FIG. 5) in the coating floating portion 12 of the floating stage 10. In addition, the cover 220 may prevent the ink (I in FIG. 5) remaining in the nozzle 300 from falling and flowing into the air hole 10*a* in the coating floating portion 12 of the floating stage 10.

For example, while the substrate loading portion 211*a*, in which the substrate 1 is loaded in the gripper 211, is in the substrate loading position, the cover 220 installed on the cover mounting portion 211*b* of gripper 211, which is the opposite side of the substrate loading portion 211*a* of gripper 211 where the substrate 1 is loaded, is disposed between the nozzle 300 and the coating floating portion 12 of the floating stage 10. As a result, the surrounding foreign matter particles (P) or the ink (I) of the nozzle 300 fall on the cover 220 instead of the air hole 10*a* of the coating floating portion 12, thereby preventing the foreign matter particles (P) or ink (I) from blocking the air hole 10*a* of the floating stage 10. Therefore, as the cleaning operation of the floating stage 10 for removing the foreign matter particles (P) or ink (I) from blocking the air hole 10*a* is not required, productivity may be improved in terms of time and costs.

Furthermore, although not illustrated in the drawings, the moving member 210 may be a separate member other than the gripper 211 as another example. For example, the moving member 210 may be provided as a structure installed on the rail 100 and moving, as a separate member other than the gripper 211, and may be a structure that moves without being installed on the rail 100.

On the other hand, the nozzle 300 is disposed on the upper side of the floating stage 10, and the substrate 1 is coated by applying a chemical solution to the substrate 1 moved to the floating stage 10, for example, transferred between the floating stage 10 and the nozzle 300. In this case, the chemical liquid may be, for example, Red, Green, and Blue (RGB) ink, and may be used to make the substrate 1 used as a material for a display into a color substrate.

FIGS. 6A and 6B are a plan view and a cross-sectional view illustrating a cover in an apparatus for preventing blockage of a floating stage of a substrate processing appa-ratus according to a second embodiment of the present disclosure.

Referring to the drawings, the cover 220 may have an anti-fall bump 221 formed on an edge of an upper surface thereof. The anti-fall bump 221 is formed to protrude upwardly from the upper surface of the cover 220 along the rim. The anti-fall bump 221 may prevent the surrounding foreign matter particles (P) falling on the upper surface of the cover 220 or the ink (I) of the nozzle (21 in FIG. 5) from escaping to the outside of the cover 220 and falling.

In detail, the surrounding foreign matter particles P falling on the upper surface of the cover 220 may move on the upper surface of the cover 220 by external force such as movement of the cover 220, and the cover 220 blocks the foreign matter particles P from moving to the outside of the cover 220. In addition, the ink I dropped on the upper surface of the cover 220 may flow from the upper surface of the cover 220 by the external force such as movement of the cover 220, and in this case, the cover 220 blocks the ink (I) from flowing to the outside of the cover 220.

Also, a plurality of grooves 222 may be formed in an upper surface of the cover 220. As the ink (I) falling on the upper surface of the cover 220 is absorbed into the plurality of grooves 222, the ink I may be reliably prevented from escaping from the upper surface of the cover 220.

In detail, the plurality of grooves 222 may form an arrangement structure in which the plurality of grooves 222 intersect in an inclined form in the upper surface of the cover 220, as an example, as illustrated in the drawing. Furthermore, although not illustrated in the drawings, the plurality of grooves 222 may form a vertically crossed arrangement structure. Accordingly, even when the ink (I) flows in any direction on the upper surface of the cover 220, the ink (I) touches the plurality of grooves 222 crossed, and therefore, the ink may be absorbed into the plurality of grooves 222.

FIG. 7 is a view illustrating a suction member as a cleaning unit in an apparatus for preventing blockage of a floating stage of a substrate processing apparatus according to a third embodiment.

Referring to the drawings, in an embodiment of the present disclosure, a cleaning unit 230 may further be included. The cleaning unit 230 is disposed above the cover 220 and serves to clean the cover 220. The cleaning of the cover 220 by the cleaning unit 230 may be periodically performed at appropriate intervals.

In detail, the cleaning unit 230 may include the suction member 231.

The suction member 231 sucks foreign particles (P in FIG. 6) or ink (I in FIG. 6) on the upper surface of the cover 220. The suction member 231 may remove foreign matter particles or ink from the upper surface of the cover 220 by suctioning foreign matter particles or ink from the upper surface of the cover 220 with strong suction force. Of course, the specific configuration of the suction member 231 is not limited by the present disclosure, and any suction configuration of the related art may be used.

FIG. 8 is a view illustrating a cleaning member and a drying member as a cleaning unit in the apparatus for preventing blockage of a floating stage of a substrate processing apparatus according to a fourth embodiment of the present disclosure.

Referring to the drawing, the cleaning unit 230 may include a cleaning member 232 and a drying member 234.

The cleaning member 232 sprays a cleaning liquid on the upper surface of the cover 220. As the cleaning solution, pure water or the like may be used. Foreign matter particles falling on the upper surface of the cover 220 adhere to the upper surface of the cover 220 over time. Adhered foreign matter particles are not easily removed from the upper surface of the cover 220, but may be easily removed by spraying a cleaning solution by the cleaning member 232. In addition, the ink dropped on the upper surface of the cover 220 dries quickly and becomes hard. The hardened ink may be easily removed by being dissolved by spraying a cleaning liquid onto the upper surface of the cover 220 by the cleaning member 232. Of course, the detailed configuration of the cleaning member 232 is not limited by the present disclosure, and any cleaning configuration of the related art may be utilized. On the other hand, cleaning liquid contaminated by foreign particles or ink may be removed. As an example, a drain (not illustrated) is formed in one side of the cover 220 so that the cleaning liquid on the upper surface of the cover 220 may be drained to one side. In this case, a receiving member (not illustrated) for receiving the drained cleaning solution may be disposed in one lower side of the cover 220.

The drying member 234 is disposed parallel to the cleaning member 232 and dries the cover 220 wet with the cleaning solution. To rapidly switch from the cleaning operation to the application operation, the drying member 234 may dry the wet cover 220 with the cleaning liquid. As the drying member 234, any drying method of the related art, such as a drying method using multiple heat or a drying method using hot air may be used as a drying method. Of course, the detailed configuration of this drying member 234 is not limited by the present disclosure, and any drying configuration of the related art may be used.

FIG. 9 is a view illustrating a cleaning member, an ultrasonic wave generating member, and a drying member as a cleaning unit in an apparatus for preventing blockage of a floating stage of a substrate processing apparatus according to a fifth embodiment.

Referring to the drawing, the cleaning unit 230 may include a cleaning member 232, an ultrasonic wave generating member 233 and a drying member 234. In this case, a detailed description of the cleaning member 232 and the drying member 234 has already been described above based on FIG. 8, and thus, the description thereof will be omitted.

The ultrasonic wave generating member 233 is disposed parallel to the cleaning member 232 and ultrasonically vibrates the cleaning solution. For example, the ultrasonic wave generating member 233 generates ultrasonic waves in the cleaning fluid sprayed from the cleaning member 232 to vibrate the cleaning fluid with ultrasonic waves. As the cleaning liquid is vibrated by ultrasonic waves in this manner, the removal rate of foreign matter particles or ink on the upper surface of the cover 220 may be increased. For example, the cleaning effect may be increased due to the cleaning liquid vibrated by ultrasonic waves. Of course, the detailed configuration of the ultrasonic wave generating member 233 is not limited by the present disclosure, and any ultrasonic wave generating configuration of the related art may be used.

FIG. 10 is a view illustrating a suction member, a cleaning member, an ultrasonic wave generating member, and a drying member as cleaning units in an apparatus for preventing blockage of a floating stage of a substrate processing apparatus according to a sixth embodiment.

Referring to the drawings, the cleaning unit 230 may include a suction member 231, a cleaning member 232, an ultrasonic wave generating member 233, and a drying member 234. In this case, a detailed description of the suction member 231, the cleaning member 232, the ultrasonic generator, and the drying member 234 has already been described above based on FIGS. 7 to 9, and thus, descriptions thereof will be omitted.

In the cleaning unit 230, a suction member 231, a cleaning member 232, an ultrasonic wave generating member 233, and a drying member 234 are sequentially disposed in the moving direction of the moving member 210. For example, while the moving member 210 moves, the cover 220 installed on the moving member 210 moves. In the moving direction of the cover 220, the suction member 231, the cleaning member 232, the ultrasonic wave generating member 233, and the drying member 234 are sequentially disposed. When the cover 220 is moved, foreign matter particles or ink on the upper surface of the cover 220 are first sucked by the suction member 231. Then, the cleaning solution is sprayed onto the upper surface of the cover 220 by the cleaning member 232. Next, the cleaning liquid is ultrasonically vibrated by the ultrasonic wave generating member 233 to increase the cleaning effect. Finally, the cover 220 wet with the cleaning solution is dried by the drying member 234. In this manner, foreign matter particles or ink are first removed by suction of the suction member 231, and then, foreign matter particles or ink adhered thereto are removed by spraying the cleaning liquid of the cleaning member 232. In addition, during cleaning, the ultrasonic wave generating member 233 increases the cleaning effect, and the drying member 234 quickly dries the cover 220 wet with the cleaning liquid. Through this sequential process, foreign matter particles and ink on the upper surface of the cover 220 may be effectively removed.

FIG. 11 is a view illustrating an apparatus for preventing blockage of a floating stage of a substrate processing apparatus according to a seventh embodiment.

Referring to the drawings, according to an embodiment of the present disclosure, a substrate detection sensor (S) may be further included. The substrate detection sensor (S) is installed on a nozzle support 310 that is provided with the nozzle 300 installed thereon, and detects the substrate 1 below the nozzle 300. While the gripper 211 is moved to the substrate loading position, for loading of the substrate 1, before the coating of the substrate 1, and waits; the coating floating portion 12 in the floating stage 10 is not covered by the substrate 1. At this time, the substrate detection sensor S may detect the absence of the substrate 1 below the nozzle 300.

The moving member 210 is configured to move between the floating stage 10 and the nozzle 300. Unlike the above-described embodiments, the moving member 210 may be a movable body 212 that is a separate member other than the gripper 211. In detail, the movable body 212 is installed on the rails 100 disposed on both sides of the floating stage 10, as illustrated in the drawing. In this case, the rail 100 may be a member on which the gripper 211 is installed, or may be a separate member therefrom. In addition, the movable body 212 is electrically connected to the substrate detection sensor S by a controller C. The movable body 212 may have a structure moving between the floating stage 10 and the nozzle 300 when the substrate detection sensor S detects the absence of the substrate 1 below the nozzle 300. When the substrate detection sensor S detects the absence of the substrate 1 (a state in which the substrate 1 is not present) below the nozzle 300, the movable body 212 moves on the rail 100 and moves between the floating stage 10 and the nozzles 300. At this time, the nozzle support 310 on which the nozzle 300 is installed may rise so that the movable body 212 does not interfere with the surrounding components.

Therefore, the cover 220 installed on the movable body 212 may cover the upper surface of the coating floating portion 12 located below the nozzle 300, in the floating stage 10. Accordingly, the cover 220 may prevent particles of foreign matter from being introduced into the air hole 10a of the coating floating portion 12 in the floating stage 10. In addition, the cover 220 may prevent ink remaining in the nozzle 300 from falling into the air hole 10a. In detail, a driving motor (not illustrated) included in the movable body 212 may be electrically connected by the substrate detection sensor S and the controller C. Accordingly, the movable body 212 may have a structure in which the driving motor is controlled by the controller C based on the data of the substrate detection sensor S and is moved by the driving motor.

FIG. 12 is a view illustrating an apparatus for preventing blockage of a floating stage of a substrate processing apparatus according to an eighth embodiment.

Referring to the drawings, according to an embodiment of the present disclosure, a substrate detection sensor (S) may further be included. The substrate detection sensor (S) is installed on the nozzle support 310 on which the nozzle 300 is installed, and detects the substrate 1 below the nozzle 300. While the gripper 211 is moved to the substrate loading position for loading of the substrate 1 before the coating of the substrate 1 and waits, the coating floating portion 12 in the floating stage 10 is not covered by the substrate 1. At this time, the substrate detection sensor S may detect the absence of the substrate 1, which is a state in which the substrate 1 is not present below the nozzle 300.

The moving member 210 is configured to move between the floating stage 10 and the nozzle 300. Unlike the above-described embodiments, the moving member 210 may be a rotating body 213 that is a separate member, instead of the gripper 211. In detail, the rotating body 213 is installed on the nozzle support 310 as illustrated in the drawing. In addition, the rotating body 213 is electrically connected to the substrate detection sensor S by the controller C. The rotating body 213 may have a structure that rotates between the floating stage 10 and the nozzle 300 when the substrate detection sensor S detects the absence of the substrate 1 below the nozzle 300. When the substrate detection sensor S detects the absence of the substrate 1 below the nozzle 300 (a state in which the substrate 1 is not present), the rotating body 213 moves between the floating stage 10 and the nozzle 300 while rotating. At this time, the nozzle support 310 on which the nozzle 300 is installed may rise so that the rotating body 213 does not interfere with the surrounding components. Thus, the cover 220 installed on the rotating body 213 may cover the upper surface of the coating floating portion 12 located in the floating stage 10, below the nozzle 300. Accordingly, the cover 220 may prevent particles of foreign matter from being introduced into the air hole 10a of the coating floating portion 12 in the floating stage 10. In addition, the cover 220 may prevent ink remaining in the nozzle 300 from falling into the air hole. In detail, as illustrated in the drawing, the driving motor 213a included in the rotating body 213 may be electrically connected to the substrate detection sensor S by the controller C. Accordingly, the rotating body 213 may have a structure in which the driving motor 213a is controlled by the controller C based on the data of the substrate detection sensor S and which is rotated by the driving motor 213a.

FIG. 13 is a flowchart illustrating a substrate processing method according to another embodiment of the present disclosure.

Referring to the drawings, the substrate processing method according to an embodiment includes a substrate loading operation (S100), a covering operation (S110) and a substrate processing operation (S200).

As illustrated in FIG. 4, the substrate loading operation (S100) is an operation of loading the substrate 1 onto the gripper 211 by moving the gripper 211 to the loading position of the substrate 1. In addition, as illustrated in FIG. 4, the covering operation (S110) is an operation of moving the cover 220 toward the floating stage 10 for floating the substrate 1, for example, moving the cover 220 between the nozzle 300 disposed above the floating stage 10 and the floating stage 10, to cover the floating stage 10. Finally, the substrate processing operation (S200) is an operation of processing the substrate 1 on the floating stage 10 by moving the gripper 211 toward the floating stage 10. In this case, the treatment of the substrate 1 may be a coating process in which a chemical liquid is applied by the nozzle 300.

At this time, the cover 220 may be installed on the cover mounting portion 211b of gripper 211, which is the opposite side of the substrate loading portion 211a of gripper 211 on which the substrate 1 is loaded. Due to this installation structure, when the substrate loading operation (S100) proceeds, the covering operation (S110) proceeds. For example, as illustrated in FIG. 4, while the substrate loading portion 211a in the gripper 211, in which the substrate 1 is loaded, moves to the substrate loading position, the cover 220 installed on the cover mounting portion 211b of gripper 211, which is the opposite side of the substrate loading portion 211a of gripper 211 on which the substrate 1 is loaded, moves between the nozzle 300 and the floating stage 10. Furthermore, while the substrate 1 is loaded onto the gripper 211, the cover 220 is disposed between the nozzle 300 and the floating stage 10 to cover the floating stage 10.

In this manner, since the floating stage 10 is covered by the cover 220, surrounding foreign matter particles or ink of the nozzle 300 do not fall into the air hole 10a of the floating stage 10. For example, as the surrounding foreign matter particles or ink of the nozzle 300 fall on the cover 220, the foreign matter particles or ink may be prevented from blocking the air hole 10a of the floating stage 10. As a result, as the cleaning operation of the floating stage 10 for removing foreign particles or ink blocking the air hole 10a is unnecessary, productivity may be improved in terms of time and costs.

As set forth above, according to an embodiment, an effect of preventing the air intake hole of a floating stage from being clogged by including a cover that is moved between the floating stage and the nozzle and covers the floating stage may be provided.

In addition, according to an embodiment of the present disclosure, there is an advantage of cleaning the upper surface of the cover with foreign particles or ink by including a cleaning unit that cleans the cover.

While example embodiments have been illustrated and described above, it will be apparent to those skilled in the art that modifications and variations could be made without departing from the scope of the present disclosure as defined by the appended claims.

What is claimed is:

1. An apparatus for preventing blockage of a floating stage, comprising:
   a moving member reciprocating toward a floating stage for lifting a substrate; and
   a cover installed on the moving member and moved toward the floating stage by the moving member to cover the floating stage; and
   a substrate detection sensor installed on a nozzle support in which a nozzle is installed, and detecting the substrate below the nozzle,
   wherein the moving member is a movable body installed on rails disposed on both sides of the floating stage, and
   the movable body is electrically connected to the substrate detection sensor and a controller and moves between the floating stage and the nozzle when the substrate detection sensor detects an absence of the substrate below the nozzle.

2. The apparatus of claim 1, wherein the moving member is a gripper holding and transferring the substrate.

3. The apparatus of claim 2, wherein the cover is installed on a cover mounting portion of the gripper, opposite to a substrate loading portion of the gripper on which the substrate is loaded.

4. The apparatus of claim 1, wherein the floating stage is divided into an entrance floating portion, a coating floating portion and an exit floating portion in a transfer direction of the substrate, and
   the cover has a plate shape and is larger than a size of an upper surface of the coating floating portion to cover the upper surface of the coating floating portion disposed in the floating stage below the nozzle.

5. The apparatus of claim 1, wherein the cover has an anti-fall bump disposed on a rim of an upper surface thereof.

6. The apparatus of claim 1, wherein the cover has a plurality of grooves in an upper surface thereof.

7. An apparatus for preventing blockage of a floating stage, comprising:
   a moving member reciprocating toward a floating stage for lifting a substrate;
   a cover installed on the moving member and moved toward the floating stage by the moving member to cover the floating stage; and
   a substrate detection sensor installed on a nozzle support in which a nozzle is installed, and detecting the substrate below the nozzle,
   wherein the moving member is a rotating body installed on the nozzle support, and
   the rotating body is electrically connected to the substrate detection sensor by a controller, and rotates between the floating stage and the nozzle when the substrate detection sensor detects an absence of the substrate below the nozzle.

8. A substrate processing apparatus comprising:
   a rail disposed on both sides of a floating stage lifting a substrate in a longitudinal direction of the floating stage;
   a moving member disposed on the rail, moving along the rail, and holding and transporting the substrate;
   a cover installed on the moving member, moved toward the floating stage by the moving member and covering the floating stage; and
   a nozzle disposed above the floating stage and processing the substrate by applying a liquid chemical to the substrate moved toward the floating stage; and
   a cleaning unit disposed above the floating stage and cleaning the cover.

9. The substrate processing apparatus of claim 8, wherein the floating stage is divided into an entrance floating portion, a coating floating portion and an exit floating portion in a transfer direction of the substrate, and
   the cover has a plate shape and has a size larger than a size of an upper surface of the coating floating portion to cover the upper surface of the coating floating portion disposed in the floating stage below the nozzle.

10. The substrate processing apparatus of claim 8, wherein the cover has an anti-fall bump disposed on both sides of an upper surface thereof.

11. The substrate processing apparatus of claim 8, wherein the cover has a plurality of grooves in an upper surface.

12. The substrate processing apparatus of claim 8, wherein the cleaning unit includes a suction member suctioning particles on an upper surface of the cover.

13. The substrate processing apparatus of claim 8, wherein the cleaning unit includes a cleaning member spraying a cleaning liquid onto an upper surface of the cover.

14. The substrate processing apparatus of claim 13, wherein the cleaning unit further includes an ultrasonic wave generating member disposed parallel to the cleaning member and ultrasonically vibrating the cleaning liquid.

15. The substrate processing apparatus of claim 13, wherein the cleaning unit further includes a drying member disposed in parallel with the cleaning member and drying the cover wet with the cleaning liquid.

16. The substrate processing apparatus of claim 8, wherein the cleaning unit includes, a suction member suctioning foreign particles or ink on an upper surface of the cover;

a cleaning member spraying a cleaning liquid onto the upper surface of the cover;

an ultrasonic wave generating member vibrating the cleaning liquid ultrasonically; and a drying member drying the cover wet with the cleaning liquid, wherein the suction member, the cleaning member, the ultrasonic wave generating member, and the drying member are sequentially disposed in a moving direction of the moving member.

* * * * *